United States Patent [19]

Toyonaga et al.

[11] Patent Number: 4,859,496
[45] Date of Patent: Aug. 22, 1989

[54] METHOD OF PRODUCING AN ELECTRICALLY-CONDUCTIVE TRANSPARENT FILM

[75] Inventors: Yufuko Toyonaga, Hirakata; Suzushi Kimura, Toyonaka; Masaaki Ueda, Suita; Osamu Tabata, Ikeda; Saburo Kimura, Suita, all of Japan

[73] Assignee: Matsushita Electric Industrial Co., Ltd., Osaka, Japan

[21] Appl. No.: 91,971

[22] Filed: Aug. 31, 1987

[30] Foreign Application Priority Data

Sep. 2, 1986 [JP] Japan .................................. 61-206356
Sep. 2, 1986 [JP] Japan .................................. 61-206357
Dec. 18, 1986 [JP] Japan .................................. 61-299899

[51] Int. Cl.$^4$ ............................ B05D 3/06; B05D 5/12
[52] U.S. Cl. ............................ 427/53.1; 427/126.3
[58] Field of Search ................... 427/53.1, 126.3, 54.1

[56] References Cited

U.S. PATENT DOCUMENTS

| 4,042,006 | 8/1977 | Engl et al. | 427/53.1 |
| 4,146,657 | 3/1979 | Gordon | 427/126.2 |
| 4,344,817 | 8/1982 | Chamberlin | 427/126.3 |
| 4,434,189 | 2/1984 | Zaplatynsky | 427/53.1 |
| 4,500,567 | 2/1985 | Kato et al. | 427/126.3 |
| 4,502,917 | 3/1985 | Chamberlin | 427/126.3 |
| 4,569,855 | 2/1986 | Matsuda et al. | 427/53.1 |
| 4,652,463 | 3/1987 | Peters | 427/53.1 |
| 4,705,701 | 11/1987 | Akhtar | 427/126.3 |

FOREIGN PATENT DOCUMENTS

| 59-140366 | 8/1984 | Japan . | |
| 59-140367 | 8/1984 | Japan . | |
| 59-140368 | 8/1984 | Japan . | |
| 59-140369 | 8/1984 | Japan . | |
| 8101529 | 11/1979 | PCT Int'l Appl. | 427/53.1 |

*Primary Examiner*—Norman Morgenstern
*Assistant Examiner*—Marianne L. Padgett
*Attorney, Agent, or Firm*—Wenderoth, Lind & Ponack

[57] ABSTRACT

Disclosed is a method of producing an electrically-conductive transparent film. A substrate is placed in contact at its surface with a stream of reactive gas which comprises a tin compound, oxygen and an impurity material that enhances the conductivity of the film to be produced. The surface of the substrate is partially irradiated by a laser beam. The reactive gas in contact with the laser beam projected portion on the substrate surface is decomposed and deposits on the portion so that a high-conductivity transparent film of tin oxide ($SnO_2$) is formed only on the portion on the substrate surface.

6 Claims, 9 Drawing Sheets

A
INNER DIAMETER
OF INJECTION
NEEDLE 24 = 10 μ

GAS INJECTION
PRESSURE = 30 atm

11 μm
2800 A°
30 μm

B
INNER DIAMETER
OF INJECTION
NEEDLE 24 = 50 μ

GAS INJECTION
PRESSURE
= 30 atm

52 μm
2600 A°

C
INNER DIAMETER
OF INJECTION
NEEDLE 24 = 50 μ

GAS INJECTION
PRESSURE
= 1 atm

1200 A°
~100 μm

METHOD OF PRODUCING AN ELECTRICALLY-CONDUCTIVE TRANSPARENT FILM

BACKGROUND OF THE INVENTION

1. Field of the Invention

The present invention relates to a method of manufacturing an electrically-conductive film which is transparent to visible light and useful as a transparent electrode for various display devices and solar cells.

2. Description of the Prior Art

With the development of various display devices and solar cells, demand for electrically-conductive transparent films have been increasing in recent years. Among existing electrically-conductive transparent films of ITO, ZnO, $SnO_2$ and $CdSnO_4$, the ITO-based films are dominant currently because of their low resistivity. However, this type of film has a problem that indium, a component of ITO, is prone to disperse into adjacent films. In the other hand, $SnO_2$ films, which are chemically stable and low in material cost, have become drawing new attention recently.

Conventionally, the thermal CVD method has been generally used for producing the $SnO_2$ films, in which a substrate or the whole reaction chamber containing the substrate is heated so that a reactive gas surrounding the substrate is thermally decomposed to form a $SnO_2$ film on the substrate (refer to U.S. Pat. No. 4,146,657). However, in such conventional $SnO_2$ film production process since the entire space around the substrate is high in temperature, the thermally decomposed product from the reactive gas would be secondary and tertiary thermally decomposed or would react with the reactive gas which remains decomposed to form a number of bits of various sizes in the formed thin film. Moreover, intense heating of the substrate would cause inaccurate dimensions of the substrate due to distortion, warping and shrinking, deformation of functional structure which has previously been formed on the substrate, and deterioration of the composition of the substrate itself. In addition, because of its outstanding chemical stability, the formed $SnO_2$ film is highly resistant against the etching process, and therefore it is difficult to make a pattern of thin electrodes.

On the other hand, there has been known a method of forming a thin film by applying a jet of reactive gas onto the substrate surface while heating it by a laser beam so that a thin film is formed by thermal decomposition of the reactive gas, as proposed by one of the inventors of the present invention (refer to Japanese Patent Publications Nos. 59-140366, 59-140367, 59-140368 and 59-140369).

SUMMARY OF THE INVENTION

It is an object of the present invention to provide a method of producing a transparent tin oxide film having a high electrical conductivity without incurring defects in the film and distortion and warping of the substrate and having a desired pattern without applying the etching process.

Another object of the invention is to provide a method of forming a fine transparent electrode pattern and the high-density transparent wiring pattern.

The present invention resides in a production of a highly electrically-conductive transparent film of tin oxide, in which a stream of reactive gas of tin compound and impurity compound is produced in a space along which a surface of a substrate is exposed, and a desired portion of the substrate surface is irradiated by a laser beam, whereby the reactive gas in contact with the irradiated portion of the substrate surface is thermally or optically decomposed to thereby form a tin oxide film in a desired pattern on the substrate surface. This method allows the formation of a high-conductivity tin oxide film only in an intended area of the substrate, while the other area is generally kept at a low temperature during the process. The impurity compound is preferably an antimony compound or a fluorine compound.

Further, by making the stream of reactive gas in the form of a fine beam finer than the diameter of the laser beam, an electrode pattern having a strip width smaller than the diameter of the laser beam can be formed.

DESCRIPTION OF THE PREFERRED EMBODIMENTS

Figure 1:
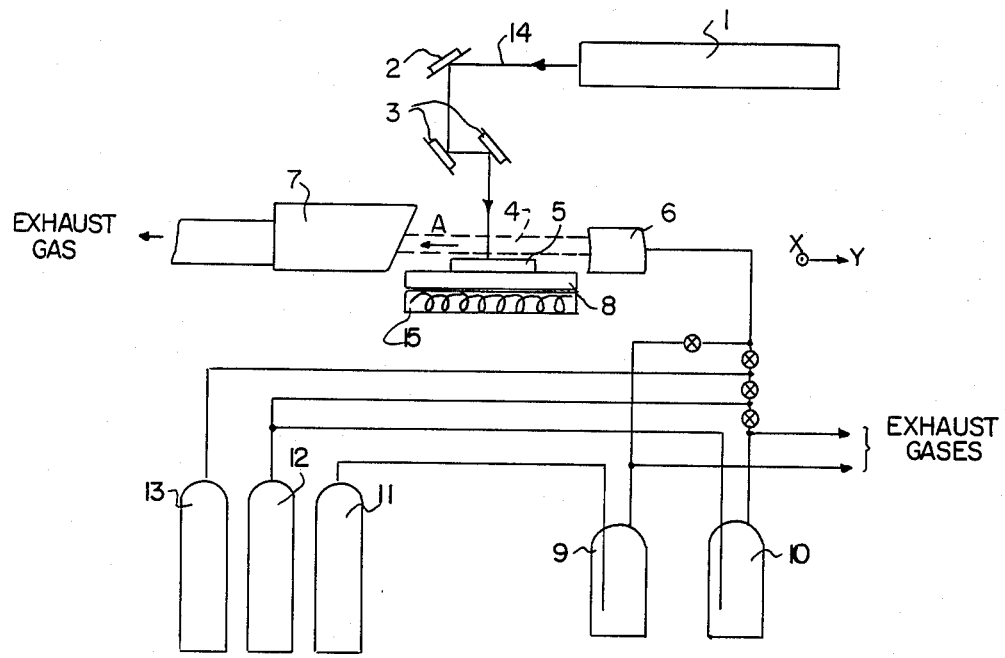
FIG. 1 is a diagram showing an arrangement of conductive transparent film producing facility in the atmosphere according to a first embodiment the present invention.

A first embodiment of this invention will now be described. Referring to FIG. 1 showing a conductive transparent film producing system in air of the first embodiment, a $CO_2$ laser beam 14 emitted horizontally by a laser oscillator 1 is reflected downward by a mirror 2, and then is rendered a 2-dimensional (X/Y) sweep operation by two rotating mirrors 3 so that a glass substrate 5 placed on a stage 8 is irradiated on its surface by being scanned in the X and Y directions. Through this operation, a portion of the substrate irradiated by the laser beam is heated instantaneously.

There is the provision of materials for a tin oxide film, including liquid dimethyltin dichloride ($(CH_3)_2SnCl_2$) as a tin compound in a tank 10 and trifluoroacetate ($CF_3COOH$) or antimony pentachloride ($SbCl_5$) as an impurity compound in a tank 9. These materials are bubbled using argon (Ar) as a carrier gas supplied from tanks 11 and 12, and, together with oxygen ($O_2$) supplied from a tank 13, injected through a reactive gas feed nozzle 6 in the direction indicated by the arrow A to form a gas stream 4 parallel to the surface of the substrate 5. The gas in contact with the heated portion of the substrate is thermally decomposed and deposited as a tin oxide ($SnO_2$) film on the substrate. The remaining gas which has not reacted exhausts through an exhaust exit 7.

Figure 2:
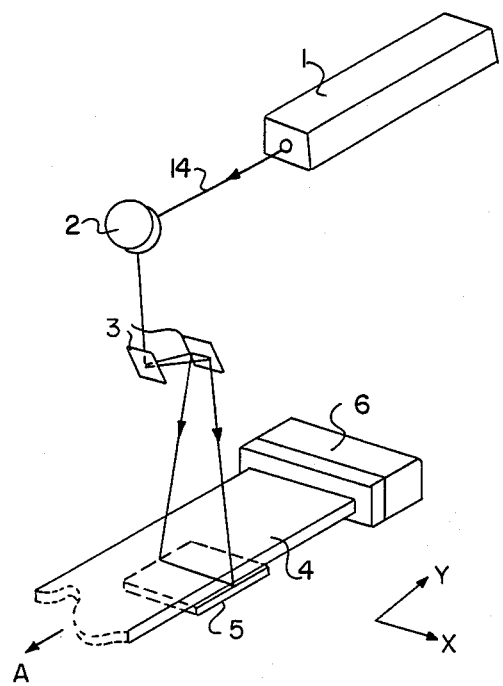
FIG. 2 is a diagram showing an arrangement of reactor section of the facility shown in FIG. 1.

In FIG. 2 showing the details of the reaction section, the gas feed nozzle 6 has three effluence grooves (not shown) each with a 1-mm width, 100-mm length arranged at intervals of 3 mm, with jet holes (not shown) being formed at constant intervals at the bottom of each of the grooves. The gas feed nozzle 6 provides a total amount of gas flow of 6 to 7 liters/minute approximately. The gas jet 4 has the shape of flat bar with a width of 100 mm and a thickness of 10 mm, and it flows horizontally on the surface of the glass substrate 5 on the stage 8 at a speed of 3 m/sec approximately.

The $CO_2$ laser beam 14 is of 50-watt power and 6 mm in beam diameter. When the rotating mirrors 3 makes a sweep of the laser beam in the Y direction on the glass substrate 5, the irradiated portion on the substrate surface is heated instantaneously. The gas stream coming in contact with the heated portion of the substrate induces the reaction of thermal decomposition, creating a deposit of tin oxide film as the laser spot moves on the substrate surface. By swinging the laser beam in the X and Y directions with the two rotating mirrors 3, a continuous planar deposition film can be produced.

Points that should be concerned in producing a conductive transparent film include low resistivity, high transmittance, high deposition rate and high uniformity of film on the substrate. The following describes the conditions which affect these properties of film.

Figure 3:
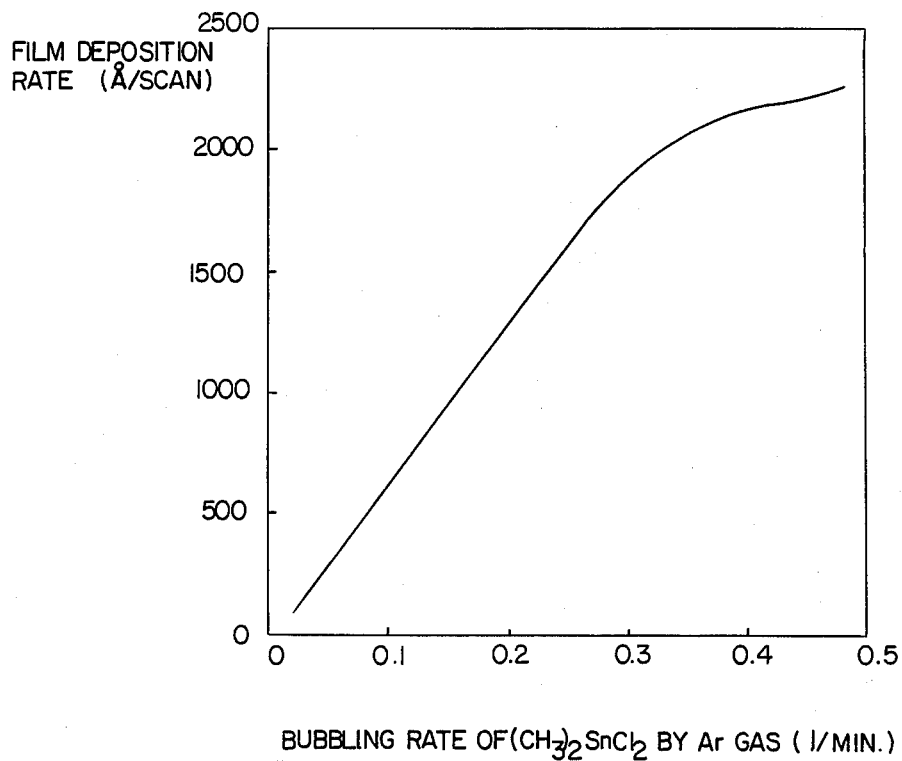
FIG. 3 is a graph showing a relation between the bubbling rate of dimethyltin dichloride ($(CH_3)_2SnCl_2$) and the film deposition speed.

The deposition rate is dependent on the concentration of gas and energy supplied from the laser beam. FIG. 3 shows on a graph the deposition rate plotted against the flow rate of Ar bubbling gas containing dimethyltin dichloride (($CH_3)_2SnCl_2$) under a 50-watt laser irradiation power. The deposition rate is mainly attributable to the decomposition of Sn gas, and the deposition rate rises with the increase in the quantity of the gas containing Sn. However, when the laser irradiated portion of the substrate has a constant temperature, the reaction speed is more associated with the substrate temperature for a supply of Sn above a certain value, resulting in a smaller change against the gas flow rate. The flow rate of the Sn gas is preferably set below the reaction-rate-determining range, i.e., in the supply-rate-determining range. The reason is that the laser beam spot generally has a Gaussian distribution of energy, and the deposited film tends to exhibit a swelling thickness distribution in correspondence to the beam intensity distribution when the Sn gas flow rate is sufficiently large, whereas a lower Sn gas concentration causes the deposition speed to become mainly dependent on the amount of supplied Sn gas, thereby flattening the thickness distribution of the film.

The supplied energy is dependent on the laser power, beam sweep speed and beam diameter. With the increase in the laser power, the thickness of deposition increases linearly, and it reaches 100 Å at the 50-watt laser power. The tin oxide film in the condition of 50-watt laser power and above-mentioned reactive gas composition has its deposition thickness decreasing sharply when the laser scanning speed rises. This is because the deposition rate depends largely on the energy supplied to a unit area of the irradiated portion, and thus on the substrate surface temperature. Too low a substrate temperature results low deposition rate for the film and also in imperfect crystallization for the film quality. Conversely, too high a substrate temperature above the deformation threshold of the material results in the creation of a local residual distortion. These are the factors which restrict the laser irradiation condition.

Figure 4:
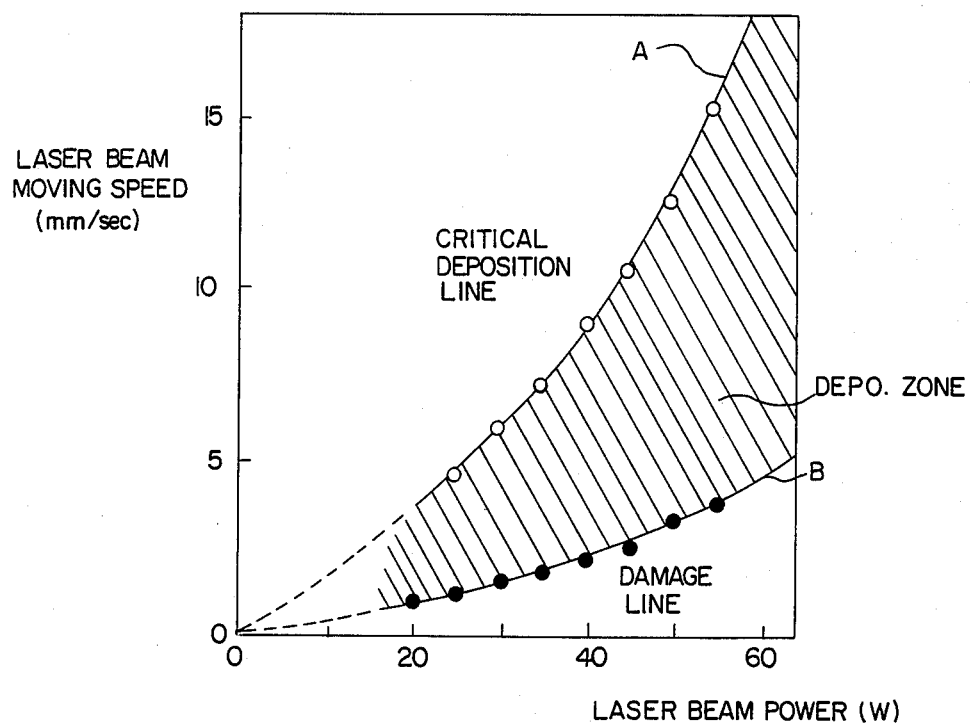
FIG. 4 is a graph showing a favorable condition of the laser beam in the first embodiment of the invention.

FIG. 4 is a graphical representation indicating the necessary conditions of the laser power and laser scanning speed in the case of a 6 mm laser beam diameter. On the graph, the curve A gives the limit condition for depositing a tin oxide film by 100 Å or more by a single laser beam scan, and the curve B gives the limit condition of creating a distortion on the glass substrate surface following the laser scanning operation. Accordingly, the hatched area defined by the curves A and B represents the necessary condition of laser beam application.

In general, a laser irradiation spot has a beam cross-sectional intensity distribution I (watt/cm$^2$) expressed by the following formula.

$$I = 2P/(\pi a^2)\exp(-2r^2/a^2)$$

where r is the distance from the beam center, P is the laser output power in watts, and a is the radius of beam. The intensity at the beam center is expressed as:

$$I_{r=0} = 2P/(\pi a^2)$$

At the beam center, the substrate is supplied with energy (J) from a moving laser beam as expressed by the following formula.

$$J_{vr=0} = I(2a/v)$$
$$= 4P/(\pi av)$$

where v is the beam moving speed.

For the supply energy $Ja_{r=0}$ at the beam irradiation portion indicated by the curve A on the graph which is the limit of film deposit creation and the supply energy $Jb_{r=0}$ indicated by the curve B which is the limit of substrate distortion, the laser condition necessary for producing adesirable tin oxide film is a combination of laser power, beam diameter and beam scanning speed which meets the following inequalities.

$$Ja_{r=0} < Jv_{r=0} < Jb_{r=0}$$

Namely, $$Ja_{r=0} < 4P/(\pi av) < Jb_{r=0}$$

In case of using borosilicade glass as the substrate the above $Ja_{r=0}$ and $Jb_{r=0}$ can be substituted by values 200 and 700, respectively, based on the experience, but generally different materials of substrate take different values for these parameters.

Next, the gas stream which causes the uniformity of the deposition film will be described. In general, the major factors which affect the uniformity of a deposition film are the gas distribution and substrate temperature distribution. Since in this embodiment the substrate temperature is determined by the laser irradiation, which is easily controlled, the gas distribution is the only influential factor for the film uniformity. As described previously, the gas feed nozzle 6 and the exhaust exit 7 are disposed to confront each other in this embodiment, and the gas flows in parallel to the substrate surface. In order for the gas steam to have a uniform flow speed and concentration, it is necessary that the gas is given a certain initial velocity when it goes out of the feed nozzle 6 and is forcedly sucked into the exhaust exit 7 so that the gas. speed is kept constant. In this embodiment, the gas speed is set to 3 m/sec approximately. A gas speed below 1 m/sec lets the gas easily disperse, resulting in a decreased film thickness in the vicinity of the exhaust exit, while a gas speed above 5 m/s does not allow a sufficient gas reaction on the substrate surface, resulting in a slower deposition rate. The above gas flow rate condition is applied to the film formation under the atmospheric pressure, and in case of the process under a reduced pressure, gas dispersion is suppressed to some extent due to lower chances of impingement among gas particles, resulting in a lower optimal gas speed.

In order to facilitate the achievement of a constant gas flow rate, the gas feed nozzle 6 and the exhaust exit 7 are preferably disposed as close to each other as possible. In this embodiment, the distance between the feed nozzle 6 and exhaust exit 7 is 15 cm approximately. When it is intended to make a larger film, a mechanism for moving the stage 8 in a 2-dimensional fashion may be added, while keeping the feed nozzle and exhaust exit at their fixed positions.

Figure 5:
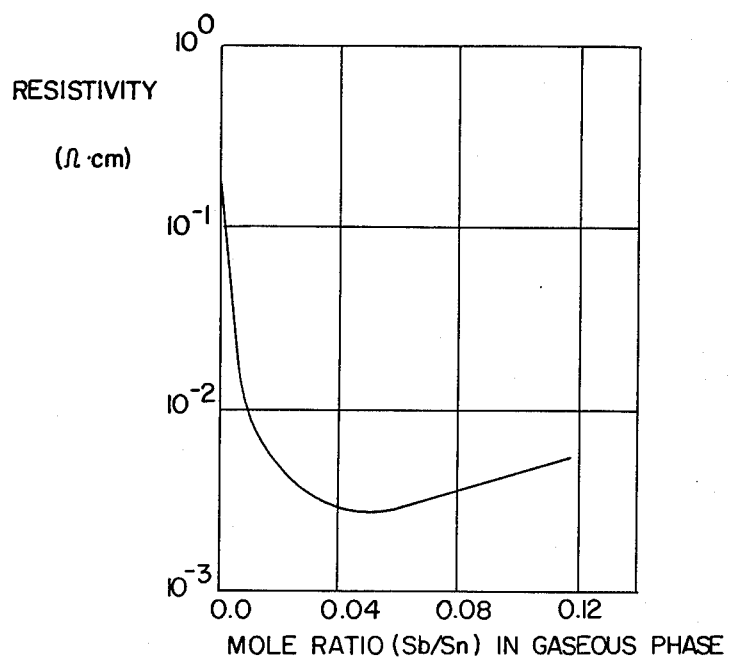
FIGS. 5 and 6 are graphs showing the variation in the electrical characteristics of the film with the composition ratios of the impurity gases to tin, i.e., antimony to tin and fluorine to tin, in the gaseous phase.
Figure 6:
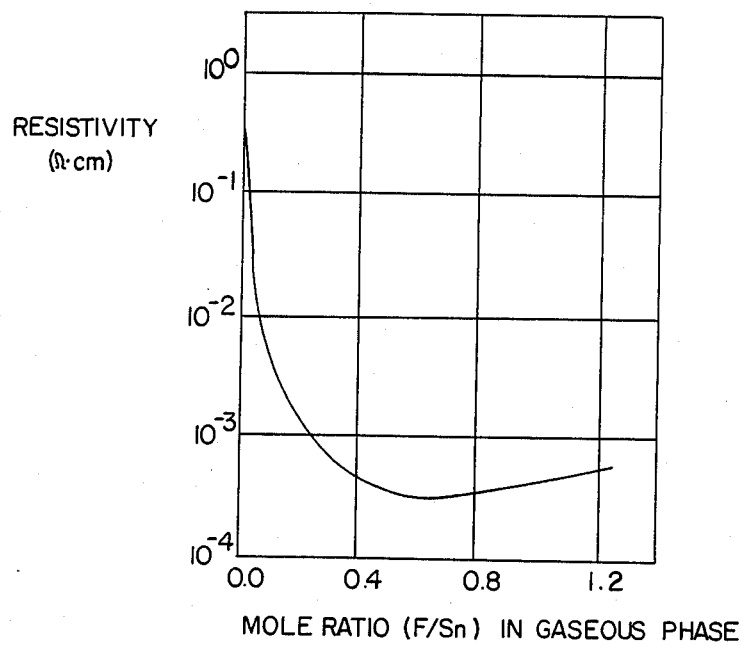

Next, the electrical characteristics of the deposition film will be described. Generally, a tin oxide film has a high specific resistance of 1 $\Omega$-cm or more, which is incomparable to the practical value for a conductive film ranging $10^{-3}$ to $10^{-4}$ $\Omega$-cm. For lowering the specific resistance of the deposition film, an impurity is doped. In this embodiment, antimony (Sb) or fluorine (F) is chosen as the doping material. These substances are extracted in the form of gas from liquid antimony pentachloride ($SbCl_5$) and trifluoroacetate ($CF_3COOH$) through the bubbling of the argon (Ar) carrier gas. FIGS. 5 and 6 show the relations between the specific resistance and the impurity-to-tin ratios, i.e., Sb/Sn and F/Sn, in the gaseous phase.

Tables 1 and 2 show the characteristics and deposition speed of films produced in various conditions.

| FIG. 1 | | | | | | |
|---|---|---|---|---|---|---|
| Sn (l/min) | Sb (l/min) | (Sb/Sn) gas [%] | (Sb/Sn) film [%] | Transmittance [%] | Resistivity [$\Omega \cdot$ cm] | Deposition rate [Å/min] |
| 0.6 | 0.2 | 0.04 | 0.04 | 75~93 | 3.3 × $10^{-3}$ | 2200 |
| 0.3 | — | — | — | 80~98 | 1.5 × $10^{-4}$ | 2200 |
| 0.3 | 0.1 | 0.04 | 0.04 | 76~92 | 2.8 × $10^{-3}$ | 2200 |
| 0.3 | 0.3 | 0.13 | 0.13 | 74~90 | 5.0 × $10^{-3}$ | 2200 |

| FIG. 2 | | | | | | |
|---|---|---|---|---|---|---|
| Sn (l/min) | F (l/min) | (F/Sn) gas [%] | (F/Sn) film [%] | Transmittance [%] | Resistivity [$\Omega \cdot$ cm] | Deposition rate [Å/min] |
| 0.3 | — | — | — | 80~98 | 1.5 × $10^{-4}$ | 2200 |
| 0.3 | 0.02 | 22 | 0.2 | 80~98 | 2.0 × $10^{-3}$ | 1100 |
| 0.3 | 0.06 | 36 | 0.7 | 80~98 | 8.0 × $10^{-4}$ | 700 |
| 0.3 | 0.08 | 44 | 0.75 | 80~98 | 5.0 × $10^{-4}$ | 500 |

The antimony-doped film with the optimal value of addition achieved a resistivity reduced to $2 \times 10^{-3}$ $\Omega$-cm, and the fluorine-doped film with the optimal amount of doping achieved a resistivity reduced to $2 \times 10^{-4}$ $\Omega$-cm. As Table 1 indicates, the antimony-to-tin ratio is substantially the same in the gaseous state and in the film, while the fluorine-to-tin ratio in the film is extremely smaller than that in the gaseous state. An increase in the antimony doping amount lowered the transmittance, while an increase in the fluorine doping amount lowered the deposition rate. Based on the above affairs, the optimal gas composition ratio of antimony to tin is in the range of 0.02–0.10, preferably 0.03–0.05, and that of fluorine to tin is about 0.2, preferably in the range of 0.4–0.8.

In this embodiment of the invention, for of enhancing the electrical characteristics, a heater 15 is used to preheat the substrate 5 on the stage 8 as shown in FIG. 1. The effectiveness of this preheating appearing in the characteristics of a deposition film of the case with the aforementioned doped fluorine is shown in Table 3.

| FIG. 3 | |
|---|---|
| Preheating temperature (°C.) | Resistivity disparity along beam traversing direction ($\Omega$ — cm) |
| 0 | 40~7.0 × $10^{-4}$ |
| 100 | 45~7.0 × $10^{-4}$ |
| 200 | 20~6.5 × $10^{-4}$ |
| 350 | 11~6.0 × $10^{-4}$ |
| 400 | 8~5.3 × $10^{-4}$ |
| 450 | 6~5.0 × $10^{-4}$ |

The resistivity is obviously reduced by the preheating of the substrate, and in addition the disparity of specific resistance along the beam traversing direction is also reduced. The preheating avoids a sharp rise in the substrate temperature, resulting in a smaller difference of temperature at the beginning and end of deposition, whereby the film has more uniform characteristics in the depth direction. However, if the preheating temperature is too high, the deposited film pattern collapses at the edge, deposits are created in areas other than the laser irradiated portion, and the substrate warps. Therefore, the preheating temperature must be kept lower than the thermal decomposition start temperature of the reactive gas.

In the case of this embodiment, the optimal thermal decomposition temperature for the reaction gas is 450° C. and the preheating temperature which provides the resistivity reduction effect is above 350° C. approximately. However, preheating above 450° C. creates deposits outside the laser irradiated portion. Therefore, a proper preheating temperature is in the range of 350°–400° C. Collapse of the film pattern edge to some extent due to a high preheating temperature can behave a buffer action which reduces the unevenness of thickness in adjoining strips in forming a planar deposition film, and it can be an effective means for making a planar tin oxide film with a uniform thickness.

Although in this embodiment a heater disposed beneath the stage 8 is used as a means for preheating, other possible heat sources include an infrared lamp providing a heat radiation from above the substrate, and a preheating laser source provided separately from the main reactive deposition laser source.

Although in the above embodiment the tin oxide film forming reactive process is carried out in the atmosphere, it is also possible to have the process in the sealed atmosphere or under reduced pressure by use of a reaction chamber.

Next, a second embodiment of this invention will be described. This embodiment is intended mainly to form a fine line electrode pattern having a width of the order of 10 $\mu$m.

Figure 7:
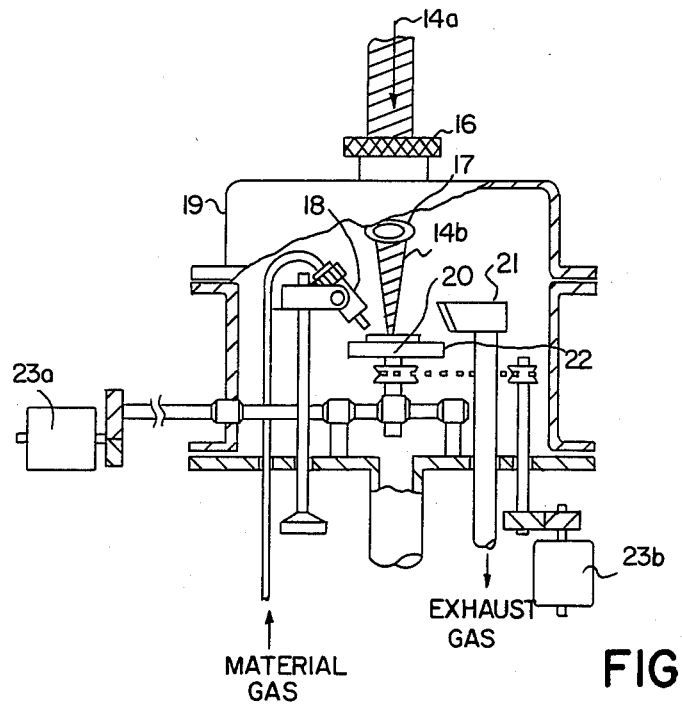
FIG. 7 is a diagram showing an arrangement of conductive transparent film producing facility according to a second embodiment of this invention.
Figure 8:
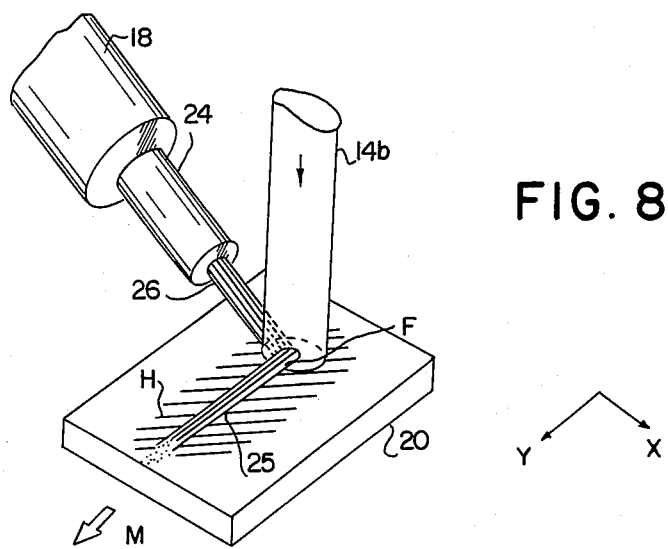
FIG. 8 is a partial enlarged view of film forming process according to the second embodiment of this invention.

FIG. 7 shows a system arrangement of the second embodiment, and FIG. 8 shows the details of the film depositing section. In FIG. 7, a chamber 19 is set to have an interior pressure below $10^{-3}$ torr, and it has a laser irradiation window 16 in which a plate of ZnSe is set. A stage 22 has dimensions of 10 mm $\times$ 10 mm, and it is movable in a 2-dimensional fashion by means of associated motors 23a and 23b. A substrate 20 is made of glass. A $CO_2$ laser beam 14a has a 6-watt power and a 6-mm beam diameter, and it is converged by a ZeSe lens 17 (diameter=20 mm, f=100 mm) disposed within the chamber 19 to be a beam 14b for forming a beam spot of a 500 $\mu$m diameter on the surface of the glass substrate 20. A high-pressure injection nozzle 18 made of stainless is about 10-mm in diameter and 5-mm in length, and it is designed to sustain a 60-atm pressure. The nozzle 18 is provided on its tip with an acute alumina injection needle 24 (inner diameter: 10 $\mu$m, length: 10 mm), as shown in FIG. 8. The needle tip is directed to the irradiation center F of the laser beam and it is precisely approached to a 5-mm distance from the laser spot center at a 35°-angle with respect to the laser beam incident axis. A high-pressure, high-speed reactive gas molecular beam 26 is produced and impinged on the laser irradiation center F, while exhausting the gas from the substrate surface through an exhaust port 21. During the process, the stage 22 is given a motion in the X or Y direction at a constant interval. Despite the large laser beam of 500 $\mu$m in diameter, a tin oxide electrode pattern 25 with a 11-$\mu$m line width and 60-mm length was formed.

FIG. 8 shows the formation of the deposition film, with the substrate 20 being moved in the Y direction shown by the arrow M. The hatched portion indicated by H in the figure is a heated zone on the substrate surface exerted by the laser beam irradiation. The total processing time for making 180 lines of electrodes at intervals of 30 $\mu$m was 20 minutes approximately.

The material, or reaction gas has the same composition as that of the first embodiment, including dimethyltin dichloride (($CH_3)_2SnCl_2$) and animony pentachloride ($SbCl_5$) each gasified by bubbling using the argon (Ar) carrier gas. The gas composition ratio of tin, oxygen and antimony is 1:0.3:0.04, and the injection pressure is 30 atm. The line electrode formation speed was 1.5 cm/sec, the film thickness was slightly smaller than 3000 Å in average, and the resistivity was $3 \times 10^{-3}$ $\Omega$-cm.

Figure 9:
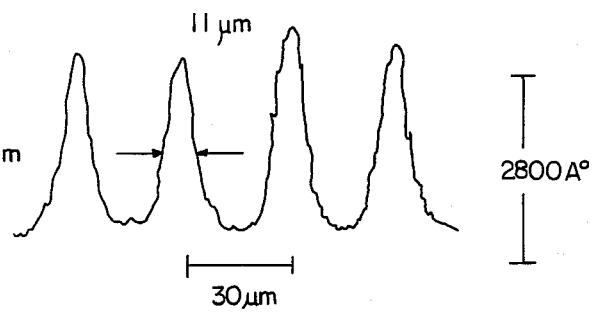
FIG. 9 is a set of graphs showing the influence of the diameter of the alumina injection needle nozzle and produced gas jet pressure on the cross-sectional shape of deposit film.
Figure 9:
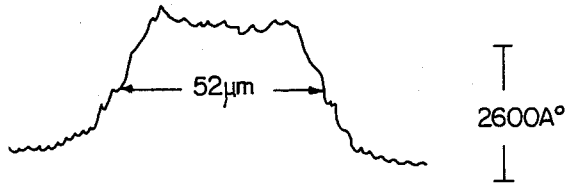
Figure 9:
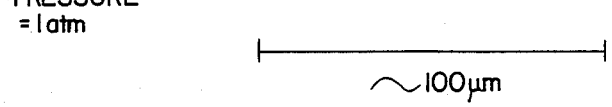

The following describes the width of line electrodes and separation between adjacent electrodes in this embodiment, with reference to FIG. 9. In the figure, shown by A and B are profiles of line electrodes produced in accordance with the foregoing second embodiment of the invention. These charts indicate the achievement of the line width comparable with the inner diameter of the alumina injection needle 25 provided at the tip of the high-pressure injection nozzle 18. With the gas injection pressure being set to 30 atm, the alumina injection needle 24 having a 10-$\mu$m inner diameter (FIG. 9, A) and 50$\mu$m inner diameter (FIG. 9, B) produced half-value line widths of 11 $\mu$m and 52 $\mu$m, respectively. It was confirmed that the gas injection pressure must be kept at least 5 atm in order to maintain the constant accuracy of line width and a gas pressure below 5 atm caused an increase and variation in the line width as shown for example by C in FIG. 9, in which case the gas injection pressure reduced to 1 atm resulted in a line width expansion beyond 100 $\mu$m. It is understandable from the cross-sectional shape of line films in FIG. 9-A that the inter-line separation is satisfactory. The result of measurement of the resistance between lines exhibited a sufficiently high insulation, which ranged 600 k$\Omega$ to 1.7 M$\Omega$. The line film deposition rate is proportional to the laser beam power and molecular beam gas concentration in principle.

Figure 10:
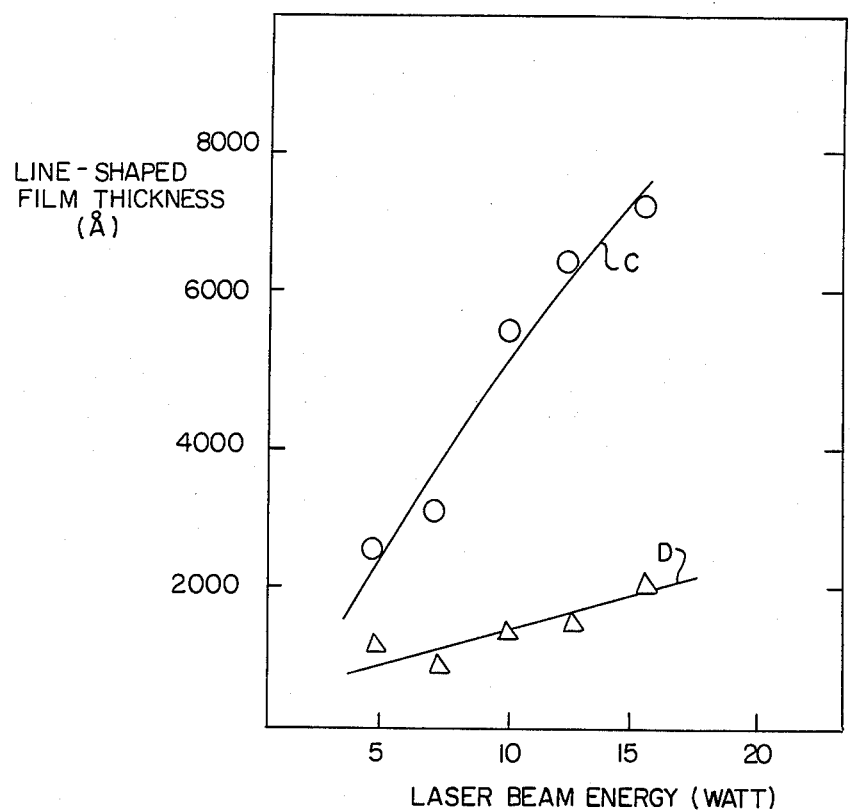
FIG. 10 is a graph showing a relationship between the thickness of the produced line-shaped film and the material gas jet pressure.

FIG. 10 is a measurement result showing that the gas injection pressure, i.e., the magnitude of gas concentration, at the 10-$\mu$m alumina injection needle has the influence not only on the line width, but also on the deposition rate of a line film. The curve C shows the thickness of the line film at a 30-atm gas injection pressure, and the curve D shows the film thickness at a 1-atm pressure. The 30-atm high-pressure material gas produced a film thickness four times as much as the case of the 1-atm low-pressure material gas.

In the above second embodiment of the invention, formation of a line film narrower than the laser heated zone by making a material gas molecular beam which is finer than the heating laser beam to impinge on the substrate, and formation of a line film having a width equal to the inner diameter of the gas injection nozzle by applying a jet of high-pressure material gas at several atm or above from the position close to the substrate are accomplished favorably by following the following four conditions.

(1) The alumina injection needle 24 at the tip of the material gas injection nozzle 18 is made to have as small inner diameter as possible down to the limit of machining (e.g., a diameter of 1 $\mu$m or less).

(2) The gas jet speed, i.e., gas pressure, is made as high as possible and constant as well (e.g., 10 atm or more).

(3) The injection needle 24 is positioned as closer to the laser irradiated portion as possible, although its shape is arbitrary (e.g., 10 mm or smaller distance).

(4) Preferably, the deposition process is carried out in the environment of reduced pressure or vacuum.

In both the first and second embodiments, the laser irradiated portion on the substrate is partially heated for film deposition to the gas thermal decomposition temperature, but such a heated portion is confined to the surface layer of the substrate only at the instance of laser beam irradiation. Accordingly, film formation can take place in generally low-temperature process without accompanied by a temperature rise of the entire area of the substrate. In consequence, the creation of bits in the film and various defects including warping and distortion of the substrate attributable to the secondary and tertiary reactions, which occurred in the conventional high-temperature process, can be prevented.

Although in the above first and second embodiments dimethyltin dichloride (($CH_3)_2SnCl_2$) is used as the tin compound other materials can also be used, provided that they are in a liquid or gaseous state normally or by being heated, and can be applied in the form of tin-compound gas stream to the reactive substrate portion by use of an inert carrier gas. Such materials, besides those mentioned in the foregoing embodiments, include: tin tetrachloride ($SnCl_4$), tetramethyltin (($CH_3)_4Sn$), monobutyltin trihydride ($C_4H_9SnH_3$), monobutyltin trichloride ($C_4H_9SnCl_3$), dibutyltin dichloride (($C_4H_9)_2SnCl_2$), dibutyltin oxide (($C_4H_9)_2SnO$), tetrabutyltin (($C_4H_9)_4Sn$), dioctyltin dichloride (($C_8H_{17})_2SnCl_2$), dioctyltin oxide (($C_8H_{17})_2SnO$), tetraoctyltin (($C_8H_{17})_4Sn$), dibutyltin dimethoxide (($C_4H_9)_2Sn(OCH_3)_2$), tetrabutoxytin (($C_4H_9O)_4Sn$) and dibutyltindiacetate (($C_4H_9)_2Sn(OCCH_3)_2$).

Besides trifluoroacetate ($CF_3COOH$) mentioned in the embodiments, other fluorine compounds useful as impurity gas include: fluorine ($F_2$), hydrofluoric acid (HF), nitrogen trifluoride ($NF_3$), sulfur hexafluoride ($SF_6$), monochlorodifluoromethane ($CHClF_2$), dichlorodifluoromethane ($CCl_2F_2$), trifluoroethanol ($CF_3CH_2OH$), ditrilfluoroethanol (($CF_3)_2CHOH$), trifluorotrichloromethane ($CF_3CCl_3$), ammonium fluoride ($NH_4F$), tetrafluoromethane ($CF_4$), trifluoroiodemethane ($CF_3I$), trifluoromonobromomethane ($CF_3Br$), trifluorosulfur pentafluoride ($CF_3SF_5$), sulfur pentafluoride monobromine ($SF_5Br$), pentafluorobromoethane ($C_2F_5Br$), heptafluorobromopropane ($C_3F_7Br$), pentafluoroiodethane ($C_2F_5I$), heptafluoroiodepropane ($C3F7I$) and sulfur pentafluoride monochloride ($SF_5Cl$).

And, besides antimony pentachloride ($SbCl_5$) mentioned in the embodiments, other antimony compounds useful as impurity gas include: antimony trichloride ($SbCl_3$), triphenylantimony (($C_6H_5)_3Sb$), antimony trihydide ($SbH_3$), antimony trioxide ($Sb_2O_3$), antimony pentoxide ($Sb_2O_5$), antimony trifluoride ($SbF_3$), antimony tribromide ($SbBr_3$), antimony triiodide ($SbI_3$) and antimony pentafluoride ($SbF_5$). Still other materials in the form of compound useful as an impurity of film formation are chlorine, phosphorus, arsenic, indium, iodine, bromine, tellurium, thallium, and tungsten, and the same effect as the embodiments can be expected using these materials.

Although in the above first and second embodiments the $CO_2$ laser as a laser source and a sheet of glass as a substrate are used, the present invention is not confined to this combination. Any laser source providing a great heating effect by irradiation on the substrate can be used. It is desirable for the substrate to absorb laser energy efficiently. On this account, there are suitable combinations between the material of substrate and the type of laser source. Besides the combination of the $CO_2$ laser and glass substrate in the foregoing embodiments, a silicon substrate matches well to the Ar laser, Kr laser and ruby laser, while a ceramic or glass substrate matches well to the YAG laser and HF/DF chemical laser, and the $CO_2$ laser as well. Although these laser sources provide a visual or infrared light beam, it is also possible to use a laser source in the ultraviolet domain to accomplish film deposition through photo-decomposition of reactive gas. The heat source is not limited to a laser beam, but variant ones in the form of a beam which provide gas decomposing energy, e.g., ion beam or electron beam, can be used to accomplish film deposition similar to the above embodiments.

What is claimed is:

1. A method of producing an electrically-conductive transparent film, comprising the steps of: projecting a laser beam to a surface of a substrate; moving said substrate in a two-dimensional fashion; and applying a beam of reactive gas comprising a tin compound, oxygen and an impurity material which enhances the conductivity of said film to the laser beam projected portion on said substrate surface, said beam of reactive gas being finer than said laser beam, whereby said reactive gas is decomposed and deposits on said substrate surface thereby to form a fine line-shaped film.

2. The method according to claim 1, wherein said beam of reactive gas is injected with an injection pressure of 10 atm or more.

3. The method according to claim 1, wherein said reactive gas comprises a tin compound, oxygen and an impurity material which enhances the electrical conductivity of said film.

4. The method according to claim 3, wherein said impurity material comprises a material selected from the group consisting of fluorine, antimony, chlorine, phosphorus, arsenic, indium, bromine, tellurium, thallium, tungsten and a compound thereof.

5. The method according to claim 4 wherein said impurity material comprises antimony (Sb) and a mole ratio of antimony (Sb) to tin (Sn) is ranging from 0.02 to 0.10 in the beam of reactive gas.

6. The method accroding to claim 4, wherein said impurity material comprises fluorine (F) and a mole ratio of fluorine (F) to tin (Sn) is 0.2 or more in the beam of reactive gas.

* * * * *